United States Patent [19]

Fujita et al.

[11] Patent Number: 4,926,239
[45] Date of Patent: May 15, 1990

[54] PLASTIC ENCAPSULANT FOR SEMICONDUCTOR

[75] Inventors: Kazuya Fujita, Nara; Takamichi Maeda, Yamatokoriyama; Masao Hayakawa, Soraku, all of Japan

[73] Assignee: Sharp Kabushiki Kaisha, Osaka, Japan

[21] Appl. No.: 390,448

[22] Filed: Aug. 2, 1989

Related U.S. Application Data

[63] Continuation of Ser. No. 7,127,405, Dec. 2, 1987, abandoned, which is a continuation of Ser. No. 6,618,455, Jun. 7, 1984, abandoned.

[30] Foreign Application Priority Data

Jun. 7, 1983 [JP] Japan ................................ 58-103452

[51] Int. Cl.$^5$ .................... H01L 23/28; C08F 283/00; C08G 77/04
[52] U.S. Cl. ...................................... 357/72; 525/481; 525/487; 528/27
[58] Field of Search .................. 357/72; 525/487, 481; 528/27

[56] References Cited

U.S. PATENT DOCUMENTS 4,287,326 9/1981 Mikami ................................ 528/27
4,327,369 4/1982 Kaplan ................................ 357/72
4,367,318 1/1983 Ishimura et al. ................. 525/481

OTHER PUBLICATIONS

Lee and Neville, Handbook of Epoxy Resins, McGraw Hill, ©1967, pp. 1-2, 25, of Chap. 24, Gr. 143, TP1180.E6 L4 C.6.

Primary Examiner—Rolf Hille
Assistant Examiner—Robert P. Limanek

[57] ABSTRACT

A plastic encapsulant for a semiconductor chip comprises an epoxy resin, an organosilicon compound, a hardener, a pigment, and an organic solvent. The epoxy resin is an epichlorohydrin-bisphenol A type epoxy resin, and the organosilicon compound is an organosilicon compound with a methoxy group, preferably, three methoxy groups. The hardener is a resol type phenol resin hardener. The organic solvent is a mixture of ketones, alcohols, and aromatic hydrocarbons.

9 Claims, 1 Drawing Sheet

PLASTIC ENCAPSULANT FOR SEMICONDUCTOR

This application is a continuation, of application Ser. No. 07/127,405 filed on Dec. 2, 1987, which is a continuation of Ser. No. 06/618,455 filed on June 7, 1984, now abandoned.

BACKGROUND OF THE INVENTION

The present invention relates to a plastic encapsulated semiconductor device and, more particularly, to a plastic encapsulant for a semiconductor chip such as an IC (integrated circuit) chip.

Recently, with the improvement of the compactness and thinness of electronic apparatus such as an electronic wristwatches, cameras, and electronic calculators, compact and thin semiconductor devices are required to be included in the apparatus.

In response to the above requirement, a method for packaging the IC chip by using a tape carrier system and a method for directly packaging the semiconductor device on a substrate have been widely applied.

In order to make the semiconductor device as thin as possible with a high reliability, it is desired to provide an improved plastic encapsulant for semiconductor devices.

SUMMARY OF THE INVENTION

It is an object of the present invention to provide a compact and thin plastic encapsulated semiconductor device with a high reliability.

It is another object of the present invention to provide an improved plastic encapsulant for a semiconductor chip.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

According to an embodiment of the present invention, the plastic encapsulant for the semiconductor chip comprises an epoxy resin, an organosilicon compound, a hardener, a pigment, and an organic solvent. The epoxy resin is an epichlohydrinbisphenol A type epoxy resin, and the organosilicon compound is an organosilicon compound with a methoxy group, preferably, with three methoxy groups. The hardener is a resol type phenol resin hardener, and the pigment is an organic pigment or an inorganic pigment. The organic solvent contains a ketone solvent, an alcohol solvent, an aromatic hydrocarbon solvent.

The amount of the organosilicon compound is less than about 30% by weight based on the total weight of the resin components including the epoxy resin, the organosilicon, and the hardener.

According to another embodiment of the present invention, the semiconductor device comprises a semiconductor chip, a supportor for supporting the semiconductor chip, and a plastic member for encapsulating the semiconductor chip to the supportor, the plastic encapsulant comprising an epoxy resin, an organosilicon compound, a resol type phenol resin hardener, a pigment, and an organic solvent.

The epoxy resin is an epichlohydrin-bisphenol A type epoxy resin, and the organosilicon compound is an organosilicon compound with a methoxy group, preferably, with three methoxy groups. The hardener is a resol type phenol resin hardener, and the pigment is an organic pigment based on a "cromophtal" (trade name) made by Ciba Geigy Limited.

The organic solvent contains a ketone solvent, an alcohol solvent, and an aromatic hydrocarbon solvent. For example, the organic material solvent contains toluene, xylene, butanol, methyl isobuthyl ketone.

BRIEF DESCRIPTION OF THE INVENTION

The present invention will be better understood from the detailed description given hereinbelow and the accompanying drawings which are given by way of illustration only, and thus are not limitative of the present invention and wherein:

FIGS. 1 and 2 show sectional views of conventional plastic encapsulated semiconductor devices packaged by using a tape carrier system; and FIGS. 3 and 4 show sectional views of semiconductor devices encapsulated with a resin according to an embodiment of the present invention, respectively.

DETAILED DESCRIPTION OF THE INVENTION

Figure 1:
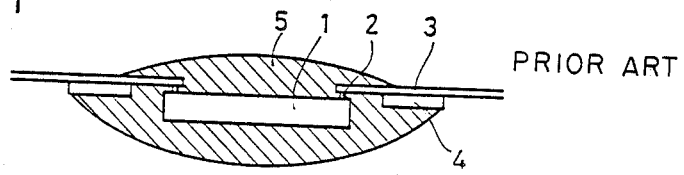
Figure 2:
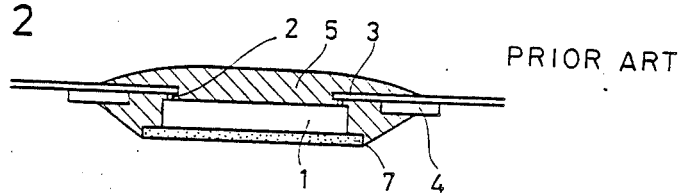

FIGS. 1-2 are sectional views of conventionally plastic encapsulated semiconductor devices packaged by using the tape carrier system.

With reference to FIG. 1, after bump electrodes 2 provided at a circumference of the surface of a semiconductor chip 1 are bonded with lead terminals 3 supported by a film 4, the chip 1 bonded with the lead terminals 3 is encapsulated with a resin 5 from both sides of the semiconductor chip 1.

With reference to FIG. 2, the surface of the semiconductor chip 1 bonded with the lead terminals 3 is encapsulated with the resin 5, and the rear surface of the semiconductor chip 1 is sealed with a glass cloth sheet 7 permeated with a semicuring resin.

Figure 3:
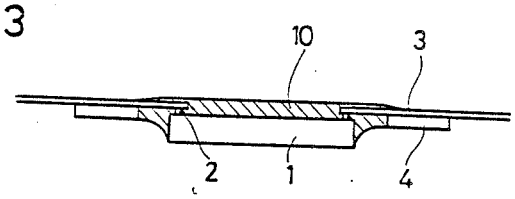
Figure 4:
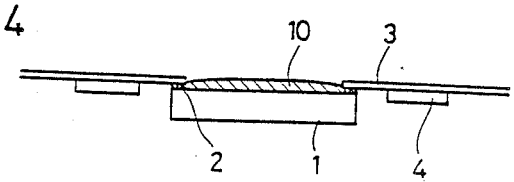

FIGS. 3 and 4 show sectional views of semiconductor devices encapsulated with a resin according to an embodiment of the present invention. In the embodiment of the present invention, a tape carrier system is used for encapsulating the semiconductor chip.

In FIG. 3, lead terminals 3 bonded with bump electrodes 2 of a semiconductor chip 1 is extensively encapsulated with a resin 10. In FIG. 4, only the surface of the semiconductor chip 1 is encapsulated with the resin 10. The chip electrodes 2 of the semiconductor chip 1 are bonded with lead terminals 3, and only the surface of the semiconductor chip 1 which is bonded with the lead terminals 3 is encapsulated with the resin 10.

According to the present invention, the plastic encapsulant (resin) 10 comprises:
(A) an epichlorohydrin-bisphenol A type epoxy resin,
(B) an organosilicon compound,
(C) a resol type phenol resin hardener,
(D) a pigment, and
(E) an organic solvent.

The compounds of the plastic encapsulant (resin) 10 will be described in detail below.

(I).(B)=(b) organosilicon compound with methoxy group:

(B) The organosilicon compound is, for example, (b) an organnosilicon compound with a methoxy group, preferably, three methoxy groups. The amount of the organosilicon compound is less than about 30 percent based on the total weight of the resin components including the epichlorohydrin-bisphenol A type epoxy resin, the organosilicon compound, the the resol type phenol resin hardener.

When a demethanol reaction occurs between the methoxy group of the organosilicon compound and a hydroxyl group of the epichlorohydrin-bisphenol A type epoxy resin, the epoxy resin is denatured to a silicon type resin by decreasing the hydroxyl group within the epoxy resin, whereby the water resistance of the epoxy resin is improved. The methoxy group which remains as an end group is reacted by a demethanol reaction with a hydroxyl group within a passivation film, for example, a $SiO_2$ (silicon dioxide) film, or a PSG (phosphate glass) film, on a surface of the semiconductor chip, so that the adhesive strength of the epoxy resin is improved.

(II).(D)=(d) organic pigment:

The pigment is, for example, (d) an organic pigment based on a "cromophtal" (trade name) made by Ciba-Geigy Limited. As the organic pigment based on the "cromophtal" is constructed by a plurality of very small particles and has a small specific gravity, the organic pigment based on the "cromophtal" shows a good dispersion and is rarely deposited even when the organic pigment is diluted with a solvent. An inorganic pigment may also be used as the pigment.

(III). (E)=(e) solvents:

The organic solvent contains several kinds of solvents in which boiling points of the solvents are different for restricting foam of the resin 10 when the resin 10 cures. The amount of the organic solvent is preferably, about 30–80 weight percent of the total weight. (e) The organic solvent contains, for example, an aromatic hydrocarbon solvent, alcohol solvent, and a ketone solvent. Preferably, (e) the organic of solvent is (e') a mixture solvent including toluene, xylene, butanol, and methyl isobutyl ketone.

The specific combinations of the plastic encapsulant 10 may be achieved in one of the following combinations (I), (II), and (III).

| (I) | (II) | (III) |
|---|---|---|
| A | A | A |
| B | b | b |
| C | C | C |
| D | d | d |
| E | e | e' |

When the semiconductor chip 1 is encapsulated with the liquid epoxy resin 10 containing the above compositions, the plastic encapsulated semiconductor device becomes a thin and compact device as shown in FIGS. 3 and 4, for example, the thickness of the liquid epoxy resin 10 on the semiconductor chip is about 100 μm.

The ratio of the compositions of, but not limited to, the plastic encapsulant 10 according to the embodiment of the present invention are as follows.

| Composition | Low viscosity type (30 cP) | High viscosity type (120 cP) |
|---|---|---|
| Epichlorohydrin-bisphenol A type epoxy resin | | |
| Resol type phenol resin hardener | about 10–20% | about 25–35% |
| Organosilicon compound with a methoxy group | | |
| Organic pigment based on a "cromophtal" | lower than about 5% | lower than about 5% |
| Organic solvent | about 70–80% | about 55–65% |
| Another contents | lower than about 5% | lower than about 5% |

The reliability of the semiconductor device encapsulated with the liquid epoxy resin 10 according to the present invention is higher than those of the semiconductor device encapsulated with a pellet type epoxy resin as shown in FIGS. 1 and 2.

The details of reliability evaluation tests and the results between the semiconductor chips encapsulated with the resin 10 of the embodiment of the present invention and the conventional material are described as follows with reference to tables 1–5.

(1) Sample

TABLE 1

| | Encapsulation Type | Plastic Encapsulant |
|---|---|---|
| Present Invention | FIG. 4 | the liquid epoxy resin (thickness of the resin: 100 μm) |
| Prior Art | FIG. 2 | a pellet type epoxy resin |

(2) Tests and Results

TABLE 2

| NO. | Evaluation Items | Test Devices |
|---|---|---|
| 1 | Moisture Resistance | C-MOS LSI |
| 2 | Moisture Resistance | TEG (Test Elements Group) (Al(Aluminium) interdigitated pattern) |
| 3 | Electrical Stability | TEG (Test Elements Group) (Offset Gate MOS Transistor) |
| 4 | Heat Shock Resistance | C-MOS LSI |

| Condition | Results |
|---|---|
| 85° C., 85% RH Operation | See Table 3 |
| 85° C., 85% RH, 30 V | See Table 4 |
| 125° C., $V_G = 10V$, $V_D = 5V$ | See Table 5 |
| −65° C. (30 min) ⟷ 150° C. (30 min) | After 100 cycles, no damages in the samples of the present invention and the prior art |

Where $V_G$ is a gate voltage and $V_D$ is a drain voltage.

TABLE 3

| Test | C-MOS LSI/85° C., 85% RH Operation | | | | | |
|---|---|---|---|---|---|---|
| Time (Hours) | 240 H | 500 H | 750 H | 1000 H | 1500 H | 2000 H |
| Present Invention | 0/17 | 1/17 | 0/16 | 0/16 | 0/16 | 0/16 |
| Prior Art | 0/20 | 1/20 | 1/19 | 0/18 | 0/18 | 0/18 |

Where a denominator is a test sample number and a numerator is a failure sample number after testing.

TABLE 4

| Test | TEG (Al (Aluminium) interdigitated pattern) /85° C., 85% RH, 30 V | | | | | | | |
|---|---|---|---|---|---|---|---|---|
| Time (Hours) | 240 H | 500 H | 1000 H | 1500 H | 2000 H | 2500 H | 3000 H | 3500 H |
| Present Invention | 1/10 | 0/9 | 0/9 | 0/9 | 0/9 | 0/9 | 0/9 | 0/9 |
| Prior Art | 0/30 | 1/30 | 1/29 | 0/28 | 0/28 | 0/28 | 1/28 | 1/27 |

TABLE 5

| Test | TEG (Offset Gate MOS Transistor)/ 125° C., $V_G = 10V$, $V_D = 5V$ | | |
|---|---|---|---|
|  | No. | P-Channel | N-Channel |
| Present Invention | 1 | $\partial = 0.917$ | $\partial = 0.852$ |
|  | 2 | 0.880 | 0.875 |
|  | 3 | 0.821 | 0.952 |
| Prior Art | 1 | $\partial = 2.220$ | $\partial = 1.233$ |
|  | 2 | 2.200 | 1.209 |
|  | 3 | 1.190 | 2.851 |

Where $\partial = (dI_D/dt)_{MAX}$ is a maximum of an increasing ratio/time of a leakage current $I_D$ between a drain and a source.

As the value of $\partial$ is small, the surface stability of the plastic encapsulant is superior.

According to an embodiment of the present invention, the plastic encapsulant comprises the epoxy resin containing the organic solvent devoid of any filler material such as a silica filler, so as to make the coated resin uniformly thin. The plastic encapsulant provides a superior moisture resistance and heat shock resistance, so that the adherence between the semiconductor device and its support is improved.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A semiconductor device comprising:
   a semiconductor chip;
   a support for supporting said semiconductor chip; and
   a plastic encapsulant for encasing said semiconductor chip to said supporter;
   said encapsulant consisting essentially of:
   a liquid epoxy resin;
   an organosilicon compound having at least one methoxy group;
   a resol-type phenol resin hardener;
   a pigment; and
   an organic solvent mixture in which the boiling points of the individual solvents differ;
   wherein the amount of said organosilicon compound is less than 30% by weight based on the total weight of said liquid epoxy resin, said organosilicon compound and said hardener.

2. The semiconductor device of claim 1, wherein said organic solvent mixture is present in an amount of from 30–80% by weight to the total weight of said plastic encapsulant composition.

3. The semiconductor device of claim 1, wherein said plastic encapsulant is about 100 μm thick.

4. The semiconductor device of claim 1, wherein said pigment is an organic pigment.

5. The semiconductor device of claim 1, wherein said liquid epoxy resin is an epichlorohydrin-bisphenol A type epoxy resin.

6. The semiconductor of claim 1, wherein the organosilicon compound is an organosilicon with three methoxy groups.

7. The semiconductor of claim 1, wherein said pigment is an inorganic pigment.

8. The semiconductor device of claim 1, wherein the organic solvent mixture contains a ketone, alcohol and aromatic hydrocarbon.

9. The semiconductor device of claim 1, wherein said organic solvent mixture contains toluene, xylene, butanol, and methyl isobutyl ketone.

* * * * *